United States Patent [19]
Dougal

[11] Patent Number: 4,868,911
[45] Date of Patent: Sep. 19, 1989

[54] MAGNETICALLY DELAYED VACUUM SWITCH

[75] Inventor: Roger A. Dougal, Columbia, S.C.

[73] Assignee: University of South Carolina, Columbia, S.C.

[21] Appl. No.: 196,738

[22] Filed: May 20, 1988

[51] Int. Cl.$^4$ .................. H01J 7/44; H03K 17/16; H03K 17/288
[52] U.S. Cl. ...................... 328/90; 328/65; 328/221; 307/314; 315/289
[58] Field of Search ............ 328/65, 221, 90; 307/314, 282; 315/289

[56] References Cited

U.S. PATENT DOCUMENTS

| | | | |
|---|---|---|---|
| 3,181,012 | 4/1965 | Rennie | 328/65 |
| 3,181,071 | 4/1965 | Smith et al. | 328/65 |
| 3,737,679 | 6/1973 | Cooper | 328/65 |

OTHER PUBLICATIONS

Lumped Circuit Ferrite Pulse Sharpener, M. Weiner et al., Pulsed Power Conf., 1983, pp. 150–154.
Magnetic Pulse Compression for Copper-Vapor Lasers, R. A. Petr et al., Pulsed Power Conf., 1983, pp. 236–241.
Design Considerations of Magnetic Switching Modulator, E. Y. Chu, Pulsed Power Conf., 1983, pp. 242–245.
Low-Pressure Gas Discharge Switches for Use in Fusion Experiments, R. Hancox et al., Proc. IEE, vol. 111, No. 1, Jan. 1964, pp. 203–213.
Plasma Buildup and Breakdown Delay in Triggered Vacuum Gap, A. J. Green et al., IIEE Transactions on Plasma Science, vol. PS-7, No. 2, Jun. 1979, pp. 111–115.
The Initiation of Electrical Breakdown in Vacuum—A Review, D. K. Davies, J. Vac. Sci. Technol., vol. 10, No. 1, Jan./Feb. 1973, pp. 115–121.
Studies on a Laser-Triggered, High-Voltage, High--Vacuum Switch Tube, R. J. Clark et al., 1967, pp. 367–372.
Firing Characterisitcs of a Triggered Vacuum Gap Employing a Dielectric Coated with a Semiconducting Layer, G. R. Govinda Raju et al., Journal of Applied Physics, vol. 48, No. 3, Mar. 1977, pp. 1101–1105.

*Primary Examiner*—John S. Heyman
*Attorney, Agent, or Firm*—Brumbaugh, Graves, Donohue & Raymond

[57] ABSTRACT

A vacuum gap switch is closely coupled with a saturable inductor, providing the high voltage standoff triggering range, and very fast recovery of a vacuum switch, without the drawbacks of poor turn-on performance, large jitter, and high power dissipation usually seen in vacuum gap switches.

4 Claims, 3 Drawing Sheets

FIG. 3 (a) CURRENT
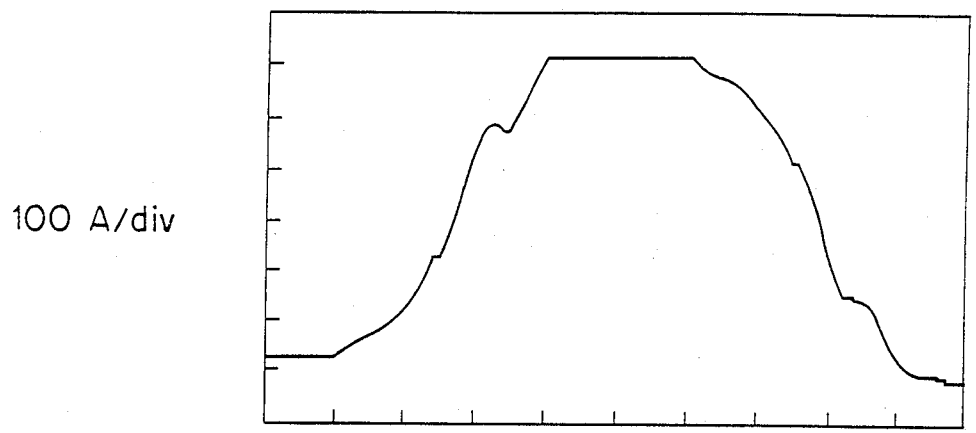
100 A/div
FIG. 3 (b) GAP VOLTAGE
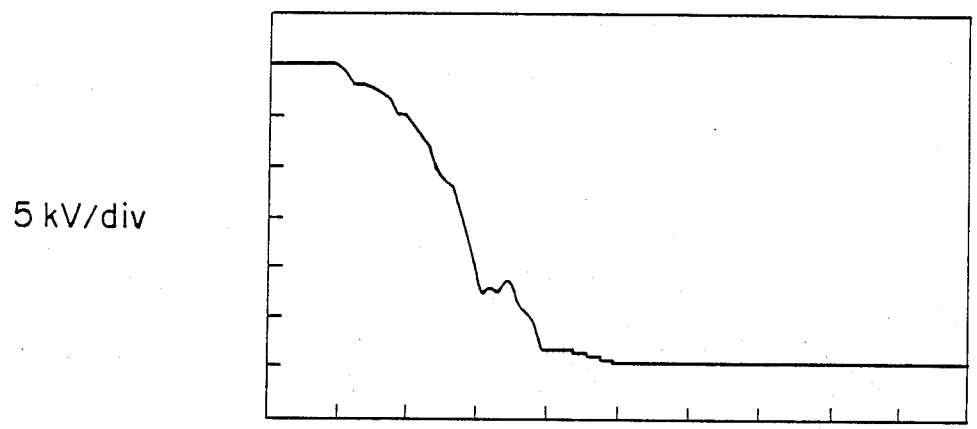
5 kV/div
FIG. 3 (c) POWER DISSIPATION
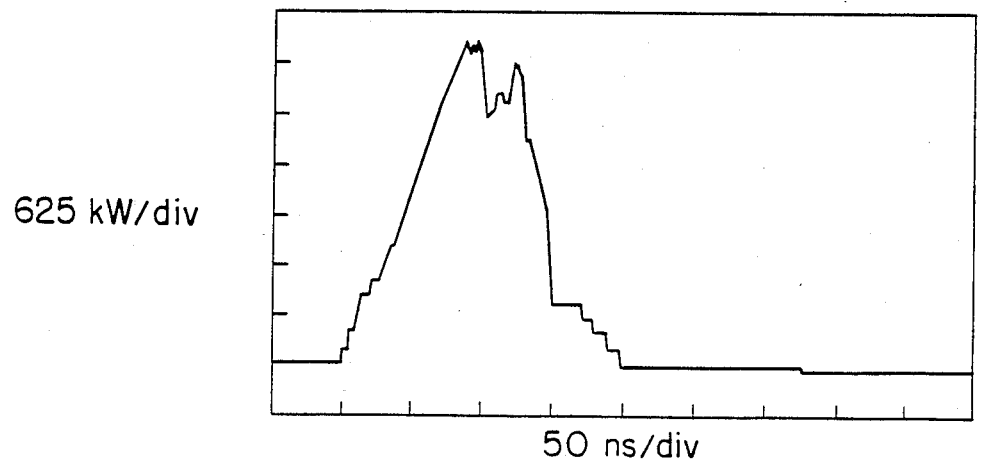
625 kW/div
50 ns/div FIG. 6 (a) CURRENT
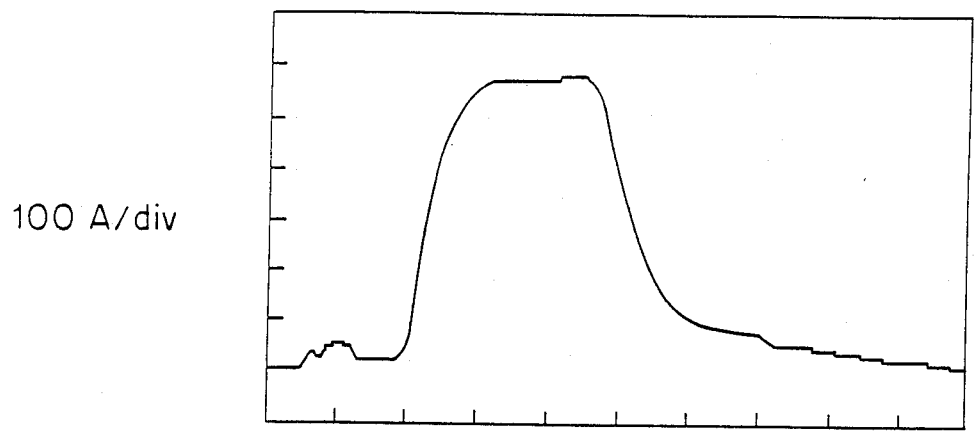
100 A/div
FIG. 6 (b) GAP VOLTAGE
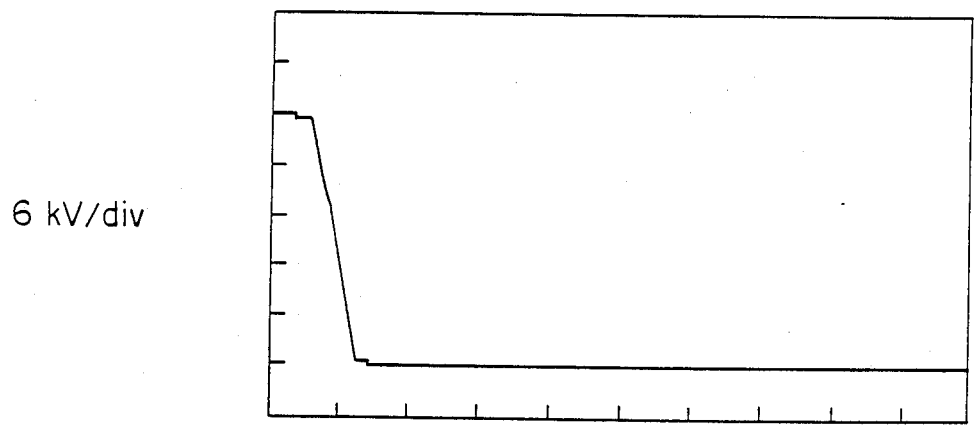
6 kV/div
FIG. 6 (c) POWER DISSIPATION
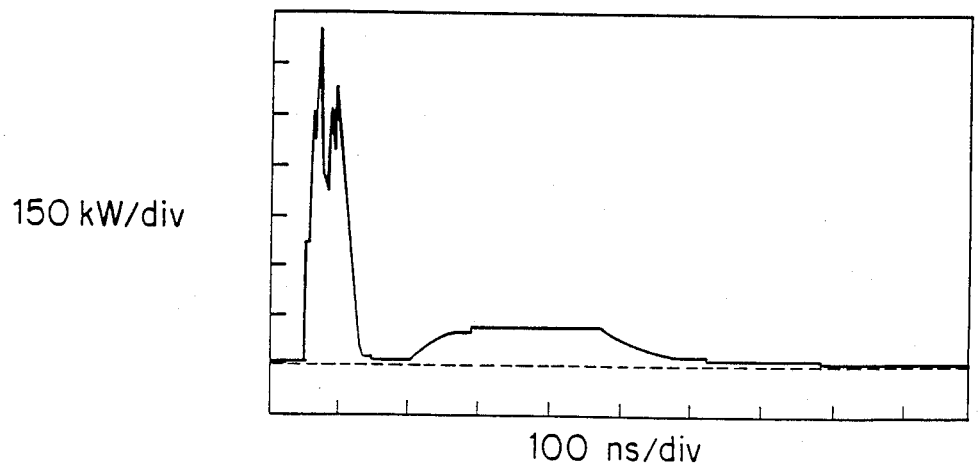
150 kW/div
100 ns/div

MAGNETICALLY DELAYED VACUUM SWITCH

BACKGROUND OF THE INVENTION

The present invention relates to a high power, fast repetition rate and high performance magnetically delayed vacuum switch.

It is not easy to switch on a high-voltage, high-current electrical circuit. For example, where a charged capacitor is to be discharged through a load, it is necessary to have a way of isolating the capacitor from the load during the charging time, and permitting current to flow from the capacitor to the load when discharge is desired.

If the capacitor is to be charged to high potential, and if the amount of energy to be transmitted to the load is substantial, common mechanical and solid-state switches may not be used. Some common switching devices cannot withstand the high voltage across the switch before it conducts. Others cannot carry the high current that flows through the switch when it conducts. Still others may not begin conducting at a predictable time.

In some applications it is desirable to operate cyclically, with a repeated charging of the capacitor and triggering of the switch to dissipate the energy in the load. Yet some switches capable of withstanding the voltage and current levels are incapable of recovering quickly enough to permit repeated triggering at the desired rate.

One device used for such switching is the well-known vacuum-insulated switching gap, also called a vacuum switch. In a vacuum switch, two main electrodes are arranged so as to be separated by a vacuum gap. Current flows, if at all, from one terminal of the charged capacitor to one main electrode, across the gap to the other main electrode, to one terminal of the load. A return path connects the other terminal of the load to the other terminal of the capacitor. Until the switch is triggered, no substantialy current flows.

Within the vacuum envelope and in addition to the two main electrodes, a trigger electrode is also provided. To permit current to flow across the gap between the main electrodes, a trigger current is passed between the trigger electrode and one of the main electrodes. The trigger current creates a plasma, which provides current carriers in the region between the main electrodes. Current then flows between the main electrodes, and the energy previously stored in the capacitor is delivered to and dissipated in the load. After the capacitor has discharged, the plasma disperses, and the switch no longer conducts. If desired, the capacitor may be recharged again for a subsequent discharge.

The vacuum switch enjoys a high voltage standoff; very little or no current flows prior to the moment the switch is turned on, even with a very high voltage across the switch. It also has a wide triggering range, so that for any of a range of voltages across the switch, it is capable of being turned on when triggered to do so. It has fast recovery: after one pulse has passed through the switch, the switch quickly becomes non-conductive. This permits a high repetition rate of charge/discharge cycles.

A vacuum switch, however, has drawbacks. For example, the switch has poor turn-on performance. An ideal switch would instantly begin conducting, and immediately carry all the desired current; a graph of current as a function of time would show a step. However, state-of-the-art vacuum switches turn on rather raggedly. A graph of current as a function of time would show a ramp or even a more irregular pattern, prior to the moment when maximum current is reached.

A vacuum switch may also suffer from jitter, that is, a fluctuation, over a series of charge/discharge cycles, in the delay between the moment of triggering and the moment when full current flow is achieved.

A vacuum switch may also suffer from high power dissipation. Prior to triggering, no power is dissipated in the switch because no current flows. After full conduction occurs, the voltage drop across the switch is minimal, so that power dissipation within the switch is minimal. But during the transition time from non-conduction to full conduction, a substantial voltage drop may exist across the switch at a time when substantial current is flowing, giving rise to unwanted dissipation of power within the switch.

These shortcomings are a direct result of the non-zero interval, sometimes called channel-preparation time or vapor traversal period, required to fill the gap between the main electrodes with a low pressure metallic vapor of sufficient density to support a high discharge current.

In an effort to minimize the difficulties caused by these shortcomings of the vacuum switch and of many other types of switch, it has been attempted in the prior art to use a pulse compression system with the switch. In a pulse compression system, a number of saturable ferromagnetic elements are separated by intervening energy stores so as to compress the pulse provided to the load. The pulse compression system, however, has the drawback that intermediate energy stores are required and makes for greater system volume.

It is an object of this invention to provide a switch which enjoys the advantages of a vacuum switch (high voltage standoff, wide triggering range, very fast recovery, and a high repetition rate) and yet does not have the disadvantages of poor turn-on performance, large jitter, and high power dissipation.

It is yet a further object of the invention to provide a switch with improved characteristics, without the necessity of the greater system volume and intermediate energy stores of a pulse compression system.

It is another object of the invention to provide a high performance switch with a fast repetition rate, and the ability to control high power.

DESCRIPTION OF THE INVENTION

In a switch of the invention, a dynamic relationship is exploited between the vacuum gap and a saturable inductor in a tightly coupled arrangement. The close-coupling technique effects an improvement in performance far greater than would be obtained by merely following the vacuum switch with a pulse compression system not tightly coupled to the vacuum switch. The close-coupled device, called a hybrid switch, overcomes the limitations of a vacuum switch by delaying the onset of significant current conduction until after a sufficiently dense vapor has been injected into the gap.

The many advantages of the proposed switching scheme are a result of the pairing of vacuum and magnetic elements. The pairing effectively suppresses three troublesome properties of vacuum gaps—the poor turn-on characteristics, high power dissipation during the turn-on phase, and severe electrode erosion, while retaining (and perhaps enhancing) the excellent recovery characteristics.

DESCRIPTION OF THE DRAWINGS

FIG. 3(a) is a plot of current through the gap as a function of time, in a typical prior art vacuum switch.

FIG. 3(b) is a plot of voltage across the gap as a function of time, in a typical prior art vacuum switch.

FIG. 3(c) is a plot of power dissipation within the gap as a function of time, in a typical prior art vacuum switch.

FIG. 6(a) is a plot of current through the gap as a function of time, in a magnetically delayed vacuum switch.

FIG. 6(b) is a plot of voltage across the gap as a function of time, in a magnetically delayed vacuum switch.

DETAILED DESCRIPTION OF THE INVENTION

Figure 1:
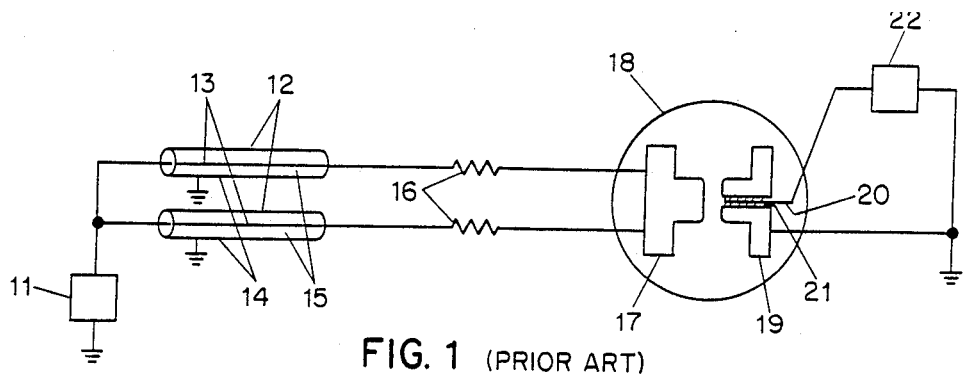
FIG. 1 is a schematic diagram of a circuit employing a prior art vacuum switch.

Referring to FIG. 1, in a prior art system a power source 11 is used to charge capacitive energy storage elements 12, such as pulse forming lines (PFLs). Each energy storage element, made typically of a coaxial transmission line with center conductor 13 and shield 14, acts as a capacitor, storing energy through the establishment of electric potential and through polarization of the dielectric 15. Each energy storage element is connected to the load, represented here by resistors 16, which connects to a first main electrode 17, contained in non-conducting vacuum envelope 18. Also in the vacuum envelope 18 are a second main electrode 19 and a trigger electrode 20. Trigger electrode 20 is separated from second main electrode 19 by insulation 21.

A triggering circuit 22, when activated, sends an electrical pulse via trigger electrode 20 to create a plasma near the trigger electrode 20 and the second main electrode 19. The plasma permits current flow between the two main electrodes, discharging the energy stored in the PFLs 12 into the load 16.

Eventually the energy storage elements 12 are discharged sufficiently that current flow through the gap ceases, and the plasma dissipates. The cycle may be repeated, if desired, beginning with the step of using the power source 11 to again charge the PFLs 12.

Figure 2:
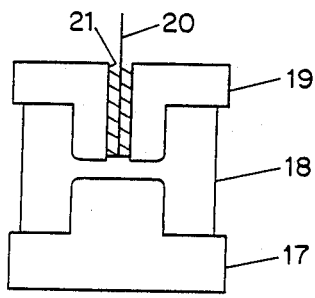
FIG. 2 shows a typical prior art vacuum switch.

FIG. 2 shows the physical configuration of a typical prior art vacuum switch. Vacuum envelope 18 provides a physical connection between first main electrode 17 and second main electrode 19. Vacuum apparatus, not shown, establishes and maintains the vacuum within the envelope. Trigger electrode 20 passes through main electrode 19, and the two electrodes are separated by insulation 21.

When the triggering circuit is activated, a spark passes between the lower end of trigger electrode 20 and the lower face of second main electrode 19. The spark creates a plasma of ionized gas, and the ionized gas eventually spreads to permit current flow between the two main electrodes 17, 19.

FIG. 3 shows observed electrical values during the firing of the prior art vacuum gap. For this observation, the PFL selected has an impedance of 25 ohms, had a time constant (time for a pulse to travel from one end of the PFL to the other and back again) of 250 nanoseconds (ns), and was charged to 30 kilovolts (kV). The load had an impedance of 25 ohms. It was desired to have a 5 ns rise time of the main current pulse from the PFL to the load.

The vacuum switch was triggered by a 100-ampere ("A") current pulse supplied by a trigger PFL with an impedence of 25 ohms and a time constant of 200 ns. The trigger PFL was charged to b 5 kV. A krytron tube switched the trigger PFL to the trigger electrode through a 25 ohm matched load.

FIG. 3(a) shows the current through the switch, increasing over an interval of 150 ns to a maximum current of about 600 A. The curve increases, then at about 100 ns it dips before reaching the maximum. FIG. 3(b) shows the voltage across the gap, starting at about 30 kV, and dropping over the same 150-ns interval to a minimum. Power dissipated in the switch is shown in FIG. 3(c); peak of about 4 megawatts (MW) is reached at about 80 ns. The energy released in the gap is equal to the area under the curve, or about 0.425 Joules (J).

Figure 4:
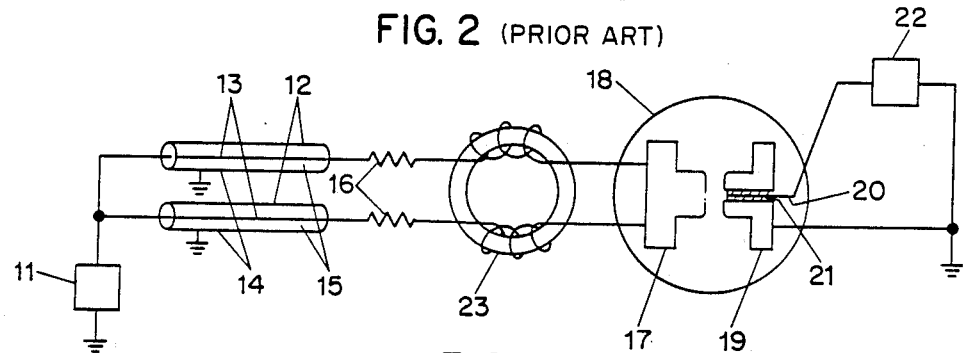
FIG. 4 is a schematic diagram of a circuit employing a magnetically delayed vacuum switch arranged according to the present invention.
Figure 5:
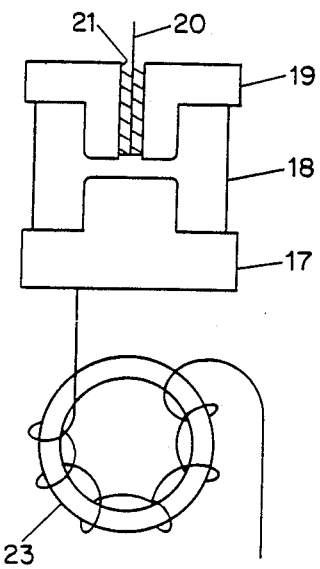
FIG. 5 shows a magnetically delayed vacuum switch according to the present invention.

Referring to FIG. 4, a system employing the switch of the invention is indentical to the prior art system but for the introduction of saturable inductor 23 immediately in series with the vacuum gap. FIG. 5 shows the physical configuration of the switch of the invention. The center conductor of each PFL is wound a number of times around the core of inductor 23. The size and composition of the inductor, and number of conductor turns wrapped around it, are selected to satisfy requirements discussed below.

During the vapor traversal period, the initial current flow is within a range such that the inductor 23 generates a large back electromotive force (EMF). A voltage drop thus develops across the inductor 23 with the result that the voltage drop across the vacuum gap is reduced. This reduces power dissipation and electrode erosion.

If the inductor 23 were absent, the high voltage across the gap would accelerate electrons and ions present between the main electrodes 17, 19 to high energies. The result would be damage to the electrodes, through needless material vaporization and ejection from the electrodes.

After an appropriate time, the current through the inductor 23 (and through the rest of the switch) increases to a level that magnetically saturates the inductor. Further increase in current does not increase the magnetization of the core and the inductance of the inductor drops substantially.

A a consequence of the drop in inductance of the inductor 23 due to its saturation, the voltage drop across the inductor is greatly lessened, and most of the voltage drop appearss across the gap and across the load. By this time, the gap has become filled with a low-pressure vapor, which achieves conduction in a diffuse mode, that is, there are no localized regions of high current density at the electrodes; current is diffuse across wide regions of the electrodes. The rate of current rise is limited only by the residual inductance in the inductor 23 and not by the current carrying capacity of the conduction channel in the vapor. The diffuse conduction channel minimizes electrode erosion during the current pulse.

FIG. 6 shows observed electrical values during the firing of the magnetically delayed vacuum gap. For this observation, the PFL selected had an impedance of 25 ohms, had a time constant of 250 ns, and was charged to 30 kV.

FIG. 6(a) shows the current through the switch. A small initial current is associated with discharging the stray capacitance. After a few tens of nanoseconds, the current rises from essentially zero to about 600 A, taking less than 100 ns to do so. The curve shows a smooth, monotonic increase during that interval.

FIG. 6(b) shows the voltage across the gap, starting at about 30 kV, and dropping very quickly (in less than 100 ns) to almost zero. Power dissipated in the switch is shown in FIG. 6(c). A peak of under 1 MW is reached, but does not last very long. The energy released in the gap is equal to the area under the curve, or about 0.08 J.

As may be seen from FIGS. 6(a) and 6(b), one effect of the saturable inductor is that the voltage and current are out of phase with each other. The result is a reduction in the power dissipation in the vacuum gap.

The size and composition of the inductor, and number of conductor turns wrapped around it, were selected for the demonstration device as follows. Prior testing had indicated that the triggered vacuum gap could sustain a current flow of some 20 A immediately upon triggering. Thus, the inductor was designed to limit the current to below 20 A during the period prior to saturation.

The delay time (time to inductor saturation) was selected to permit the plasma to propagate across the main gap of a few millimeters (mm). In the demonstration device, the gap was about 5 mm. Assuming the plasma propagates at a few times $10^6$ cm/sec, a delay time of about 200 ns was selected.

In the demonstration device, the inductor contained 3 parallel sets of 10 turns each, on a core having a cross-sectional area of $5.1 \times 10^{-4} m^2$, an inner radius of 1.9 cm, and an outer radius of 3.65 cm. The core was fabricated from three toroids, each 10 mm thick. The saturated inductance of the entire inductor assembly was approximately 2 microhenries ($\mu H$), rather than the 250 nanohenries (nH) desired to produce the 5 ns current risetime. The inductor core was reset to the negative remnance point after each current pulse by a reverse current arising from undermatching of the load to the PFL impedance.

The above values were selected for the demonstration device. They would differ for each particular application of the switch.

Figure 7:
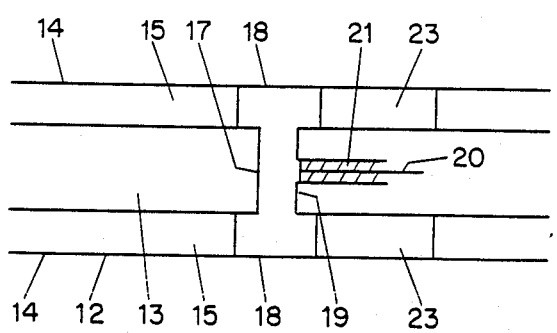
FIG. 7 shows a representation of a single-turn magnetically delayed vacuum switch incorporated into a PFL energy delivery system.

FIG. 7 shows a schematic representation of a single-turn magnetically delayed switch. PFL 12 is shown at the left, with center conductor 13 connected with first main electrode 17. Shield 14 of PFL 12 is electrically continuous with the load, not shown to the right of second main electrode 19. Dielectric 15 lies between the center conductor 13 and the shield 14. Trigger electrode 20 is separated from second main electrode 19 by insulation 21. Unlike FIGS. 4 and 5, in this embodiment the saturable inductor 25 is downstream of the vacuum gap. The inductor is nonetheless capable of limiting the current during the vapor traversal period.

Tightly coupling the inductor and vacuum gap, in order to minimize the stray capacitance between the inductor and the vacuum gap, enhances performance. Any stray capacitance, which may be discharged by a curent not flowing through the inductor, degrades performance. Prior to triggering of the vacuum gap, electrical energy is stored capacitively not only in the PFL but also in the circuit elements connected to the PFL, including any elements between the inductor and the vacuum gap that may be capacitively coupled to ground. When the vacuum gap is triggered, the energy stored in the stray capacitance quickly flows through the gap, in a manner uncontrolled by the inductor. The small peak of current early on in the plot of FIG. 6(a) is caused by such stray capacitance.

The difficulty may be avoided by tightly coupling the inductor and the vacuum gap, thus minimizing stray capacitance which can be drained by currents which are not initially limited by the saturable induction.

I claim:

1. A magnetically delayed vacuum gap heavy current power switch, comprising first and second main electrodes defining a gap, a trigger electrode adjacent to or surrounded by one of the said main electrodes, a vacuum envelope surrounding the first and second main electrodes and the said trigger electrode, and a saturable inductor means closely coupled to one of the main electrodes for minimizing stray capacitance and therefore reducing undesired power dissipation and electrode erosion of said main electrodes.

2. The magnetically delayed vacuum gap switch of claim 1, further characterized in that the inductance and saturation current of the saturable inductor means are selected so as to limit initial current flow to less than the current which may be initially sustained by the triggered vacuum gap with negligible voltage drop across the vacuum gap, and so as to saturate only after the plasma has propagated across the vacuum gap.

3. In a vacuum gap heavy current power switch comprising first and second main electrodes defining a gap, trigger electrode adjacent to or surrounded by one of the said main electrodes, and a vacuum envelope surrounding the first and second main electrodes and the said trigger electrode, the improvement of providing a saturable inductor means closely coupled to one of the main electrodes for minimizing stray capacitance and therefore reducing undesired power dissipation and electrode erosion of said main electrodes.

4. The magnetically delayed vacuum gap switch of claim 3, further characterized in that the inductance and saturation current of the saturable inductor means are selected so as to limit initial current flow to less than the current which may be initially sustained by the triggered vacuum gap with negligible voltage drop across the vacuum gap, and so as to saturate only after the plasma has propagated across the vacuum gap.

* * * * *

UNITED STATES PATENT AND TRADEMARK OFFICE
CERTIFICATE OF CORRECTION

PATENT NO. : 4,868,911

DATED : September 19, 1989

INVENTOR(S) : Roger A. Dougal

It is certified that error appears in the above-identified patent and that said Letters Patent is hereby corrected as shown below:

On the title page, under OTHER PUBLICATIONS, second column, line 13, "Characterisitcs" should read --Characteristics--;

Col. 1, line 40, "substantialy" should read --substantial--;

Col. 4, line 5, "has" should read --had--;

Col. 4, line 9, "impedence" should read --impedance--;

Col. 4, line 14, "impedence" should read --impedance--;

Col. 4, line 15, "b 5 kV" should read --5 kV--;

Col. 4, line 29, "indentical" should read --identical--;

Col. 4, line 60, "appearss" should read --appears--;

Col. 6, line 8, "curent" should read --current--;

UNITED STATES PATENT AND TRADEMARK OFFICE
CERTIFICATE OF CORRECTION

PATENT NO.   : 4,868,911

DATED        : September 19, 1989

INVENTOR(S) : Roger A. Dougal

It is certified that error appears in the above-identified patent and that said Letters Patent is hereby corrected as shown below:

Col. 4, line 5, "impedence" should be --impedance--; and

Col. 4, line 57, "A" should be --As--.

Signed and Sealed this

Sixteenth Day of October, 1990

Attest:

HARRY F. MANBECK, JR.

*Attesting Officer*                *Commissioner of Patents and Trademarks*